US006445223B1

(12) United States Patent
Thilenius

(10) Patent No.: US 6,445,223 B1
(45) Date of Patent: Sep. 3, 2002

(54) LINE DRIVER WITH AN INTEGRATED TERMINATION

(75) Inventor: Stephen C. Thilenius, Cameron Park, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/718,579

(22) Filed: Nov. 21, 2000

(51) Int. Cl.[7] ........................................ H03B 1/00
(52) U.S. Cl. ..................... 327/108; 327/538; 327/543
(58) Field of Search ............................ 327/103, 108, 327/538, 543, 170; 323/315, 316, 312; 326/30, 83, 86; 330/288

(56) References Cited

U.S. PATENT DOCUMENTS

| | | | | | |
|---|---|---|---|---|---|
| 4,808,907 | A | * | 2/1989 | Main | 323/316 |
| 5,166,635 | A | | 11/1992 | Shih | 330/253 |
| 5,204,880 | A | | 4/1993 | Wurster et al. | 375/36 |
| 5,235,218 | A | * | 8/1993 | Matsuo et al. | 327/538 |
| 5,493,205 | A | * | 2/1996 | Gorecki | 323/315 |
| 5,521,490 | A | * | 5/1996 | Manohar | 323/315 |
| 5,767,722 | A | * | 6/1998 | Kasha et al. | 326/30 |
| 5,926,049 | A | | 7/1999 | Shi | 327/170 |
| 6,172,556 | B1 | * | 1/2001 | Prentice | 327/543 |
| 6,194,967 | B1 | * | 2/2001 | Johnson et al. | 330/288 |
| 6,255,897 | B1 | * | 7/2001 | Klemmer | 327/538 |

OTHER PUBLICATIONS

"Outline," Institute of Electrical and Electronics Engineers, University of Pennsylvania (1998) pp. 1–6.

J.N. Babanezhad, "A 100MHz 50Ω–45dB Distortion 3.3V CMOS Line–Driver For Ethernet And Fast Ethernet Networking Applications," Institute of Electrical and Electronics Engineers, University of Pennsylvania (1998) pp. 1–12.

* cited by examiner

*Primary Examiner*—Terry D. Cunningham
*Assistant Examiner*—Long Nguyen
(74) *Attorney, Agent, or Firm*—Fish & Richardson P.C.

(57) ABSTRACT

A line driver with an integrated termination comprises a driver current mirror, a feedback resistor, and a controlled current buffer. The feedback resistor and controlled current buffer may be coupled between the output and the input of the driver current mirror. The controlled current buffer may respond to the static current flowing through the feedback resistor. In an embodiment, the controlled current buffer output a static current that is reduced compared to other line drivers.

9 Claims, 4 Drawing Sheets

LINE DRIVER WITH AN INTEGRATED TERMINATION

BACKGROUND

1. Field

The subject matter described herein relates generally to the field of line drivers for driving signals over a transmission line, and, more particularly, to a line driver with an integrated termination.

2. Background Information

On a private communications line, a line driver is a device that increases the possible transmission distance between stations. Typically, an end of the transmission line has a line driver.

Some line drivers draw a large static current and thus may not be suitable for low-power applications.

A need therefore exists for a driver for a transmitter that provides low current drain.

DESCRIPTION OF DRAWINGS

Like reference symbols in the various drawings indicate like elements.

DETAILED DESCRIPTION

A line driver with an integrated termination is disclosed. A particular embodiment of the line driver described herein may result in lower current drain in comparison with alternative approaches to line drivers.

Figure 1:
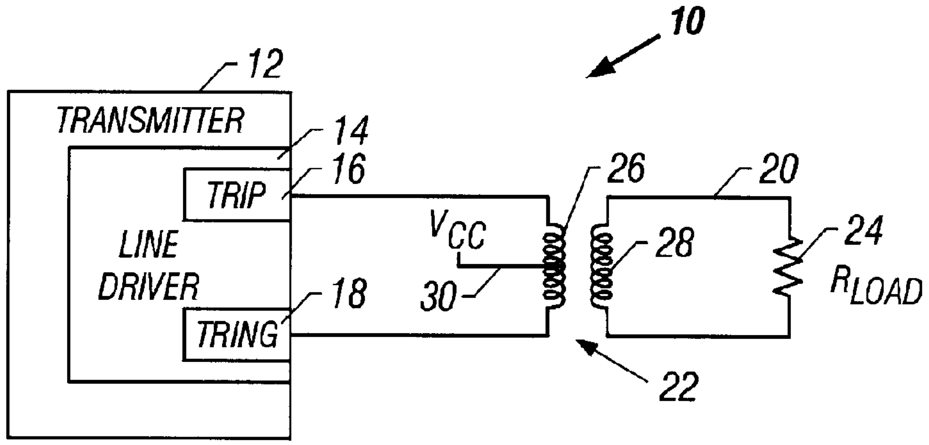
FIG. 1 (Prior Art)
FIG. 1 is an electrical schematic of a communication system.

FIG. 1 is an electrical schematic of a communication system 10. A transmitter 12 has a line driver 14 coupled with pads or pins TTIP 16 and TRING 18 of the transmitter. Further, the pads are electrically coupled to a transmission line via an isolation transformer 22. The transmission line may compromise, for example, a two-wire twisted pair cable. The load resistor $R_{load}$ 24 represents the impedance of the transmission line along with its termination load. The termination load is typically another isolation transformer and a receiver.

In one design of a center-tap line driver 10, the transformer 22 acts as a 1:1 transformer with the voltage across TTIP and TRING being seen at the load. A static current may be drawn in at each pad TTIP and TRING. Although suitable for some applications, such a line driver may not suitable for applications where current drain requirements are low, such as, for example, portable battery-powered devices.

In another center-tap line-driver design, an alternating current (AC) signal, such as, for example, a pulse, may be generated on a driven pad, the non-driven pad remains a high impedance. The driven pad begins to draw current and the current drawn by the non-driven pad does not change. As the current increases in the driven pad, a voltage is generated across one-half of the primary winding, that is, N/2 windings. Because there is no current flowing in the other half of the primary winding, other than the static current, the transformer acts as a 1:2 transformer for AC signals. For enhanced power transfer, the input impedance of the transmitter should match $R_{load}$. Thus, the input impedance of the driven pad should be $R_{load}/2^2$, or about 25 ohms for a load impedance of 100 ohms.

Figure 2:
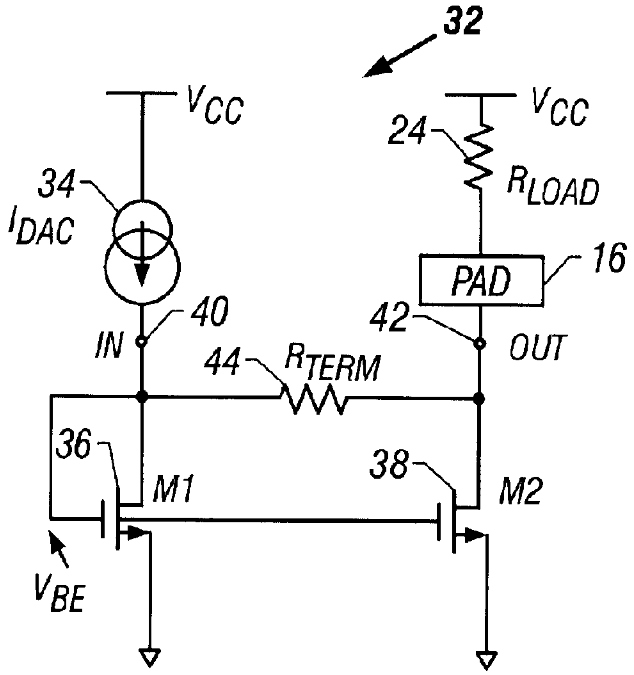
FIG. 2 (Prior Art)
FIG. 2 is an electrical schematic of a line driver with an integrated termination.

A design of a line driver 32 for a pad is illustrated in FIG. 2. $I_{dac}$ 34 represents the AC current signal that is to be driven onto the transmission line by the line driver. $R_{load}$ 24 represents the equivalent load seen on the driven pad, that is 25 ohms in the presently illustrated embodiment. $V_{cc}$ is the static center tap voltage or bias voltage.

The line driver 32 includes transistor M1 36 and transistor M2 38 arranged as a driver current mirror having an input 40 and an output 42 with a gain of 1:100. A termination resistor $R_{term}$ 44 of about 2525 ohms, may be provided between the input 40 and the output 42 of the current mirror to obtain an input impedance of 25 ohms when looking in the driver from a pad.

Figure 3:
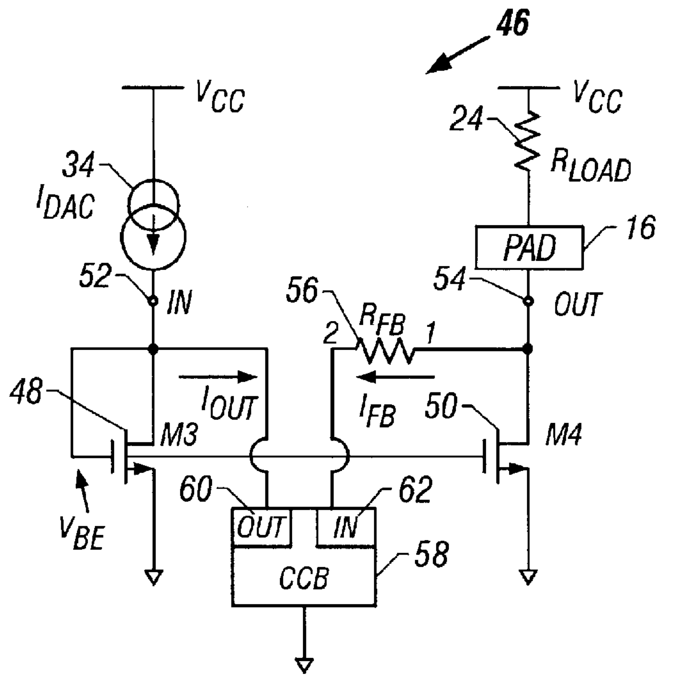
FIG. 3 is an electrical schematic of a line driver with an integrated termination, arranged according to the present invention.
Figure 4:
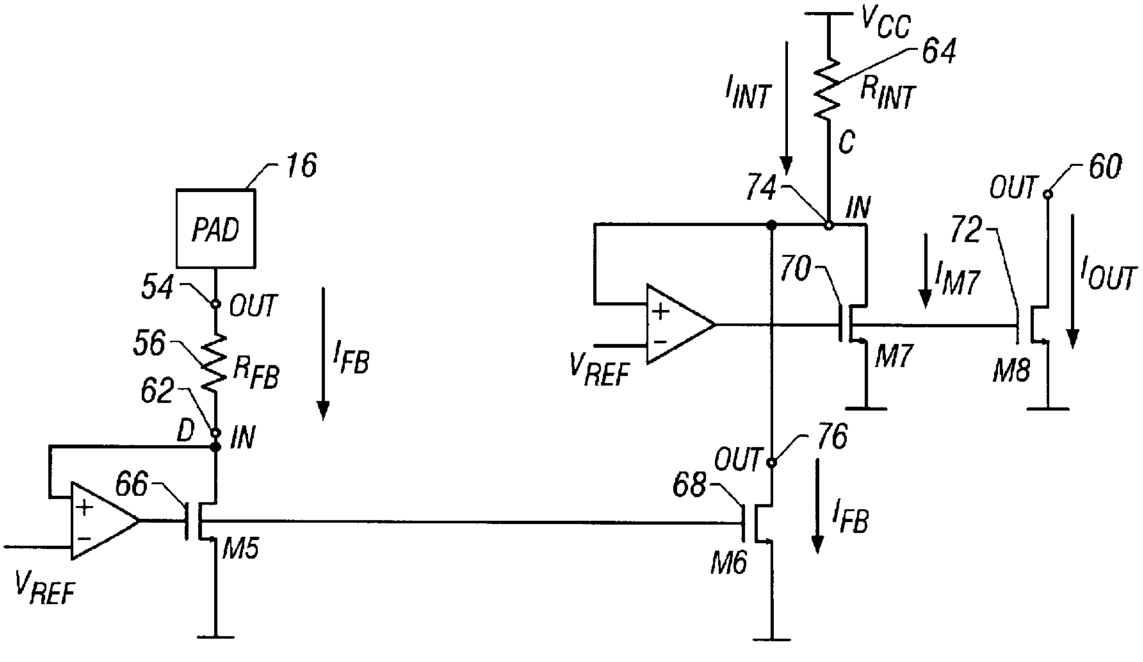
FIG. 4 is an electrical schematic of the controlled current buffer shown in FIG. 3.
Figure 5:
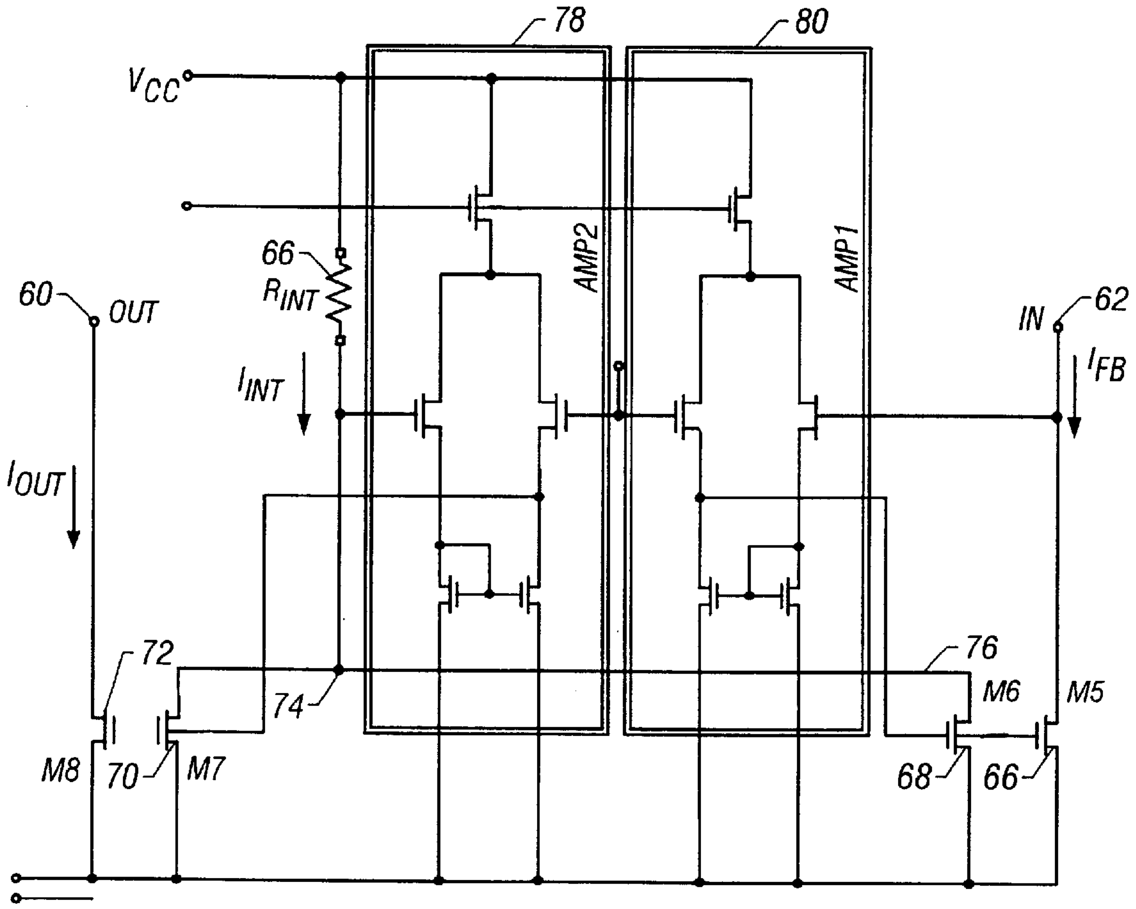
FIG. 5 is an electrical schematic of the controlled current buffer shown in FIG. 3, particularly illustrating the reference voltage circuit.

FIGS. 3–5 is an electrical schematic of a line driver 46 with an integrated termination. The present invention may be embodied in a line driver comprising, among other things, a driver current mirror.

The driver current mirror includes transistor M3 48 and transistor M4 50 arranged as a driver current mirror having an input 52 and an output 54 and a gain of 1:100. The input of the driver current mirror may be coupled with the drain of M3, and the output OUT of the driver current mirror coupled with the drain of M4. The drain and gate of M3 are coupled so that M3 acts as a diode. The base-to-emitter voltage $V_{BE}$ may be applied to M4 so that the M4 may be forced to carry the same or similar drain current as M3; that is, it mirrors the static current in M3 with a gain of 100.

The line driver further comprises a feedback resistor $R_{fb}$ 56 and a controlled current buffer (CCB) 58.

$R_{fb}$ 56 may be chosen to substantially match the impedance of $R_{load}$ 24. $R_{fb}$ may be coupled between output 54 of the driver current mirror and input 62 of the controlled current buffer 58. The output 60 of the controlled current buffer may be coupled with the input 52 of the driver current mirror.

The controlled current buffer 58 is responsive to the static current $I_{fb}$ flowing through the feedback resistor 56, in the input 62 of the controlled current buffer, to output a static current $I_{out}$ that is reduced from other line drivers. Accordingly, reduced static feedback current is provided to M3, which in turn is reduced when mirrored by M4.

For AC voltage changes on the pad, $I_{out}$ is equal to and opposite of $I_{fb}$. Thus, to obtain line-driver input impedance equal to $R_{load}$ when looking in the driver from pad 16, $R_{fb}$ 56 should be approximately 99 times $R_{load}$, or about 2475 ohms (99×25 ohms).

FIG. 4 is an electrical schematic of the controlled current buffer 58 shown in FIG. 3. The controlled current buffer comprises a first buffer current mirror, a second buffer current mirror, an internal resistor $R_{int}$ 64, and a reference voltage $V_{ref}$. The first buffer current mirror may comprise transistor M5 66 and transistor M6 68, and the second buffer current mirror may comprise transistor M7 70 and transistor M8 72.

Reference voltage $V_{ref}$ applies a reference voltage to the input 62 of the first buffer current mirror and input 74 of the second buffer current mirror. In this embodiment, the reference voltage may be 0.5 volts, although other suitable reference voltages may be employed.

The first buffer current mirror mirrors $I_{fb}$ and applies it to the input 74 of the second buffer current mirror. The input 62 of the first buffer current mirror may be coupled with an end of the feedback resistor 56 opposite the pad 16. The output 76 of the first buffer current mirror may be coupled with the input 74 of the second buffer current mirror.

Internal resistor $R_{int}$ 64 has a first end and a second end. The first end of the internal resistor may be coupled to bias voltage $V_{CC}$ and the second end of the internal resistor may be coupled with the input 74 of the second buffer current mirror.

The second buffer current mirror mirrors the current $I_{M7}$ flowing through M7 and applies the current $I_{out}$ to the input 52 of driver current mirror (see FIG. 3). The output 60 of the second buffer current mirror may be coupled with the input 52 of the driver current mirror.

The static currents $I_{fb}$ through $R_{fb}$ 56 and $I_{int}$ through $R_{int}$ 64 are defined as follows, respectively:

$$I_{fb}=(V_{pad}-V_{ref})/R_{fb}, \text{ and} \tag{1}$$

$$I_{int}=(V_{cc}-V_{ref})/R_{int}. \tag{2}$$

Thus, the drain current $I_{M7}$ of M7, and the output current $I_{out}$ of the CCB, may be defined by the following equation:

$$I_{out}=I_{M7}=I_{int}-I_{fb}=(V_{cc}-V_{ref})/R_{int}-(V_{pad}-V_{ref})/R_{fb}. \tag{3}$$

When $R_{fb}$ equals $R_{int}$, $I_{out}$ may simplify to the following:

$$I_{out}=(V_{cc}-V_{pad})/R_{fb}. \tag{4}$$

When the pad is not being driven, $V_{pad}$ equals $V_{cc}$, and thus $I_{out}$ may be minimized. This non-transference of the feedback current to M3 during static conditions has at least two significant consequences.

First, when a pad is not being driven ($I_{dac}$ equals zero), the static current being drawn by a non-driven pad may be defined by equation 1, which in this embodiment may be approximately 1.13 mA (3.3 volts minus 0.5 volts divided by 2475 ohms). $R_{int}$ draws a similar amount of current, for a total of 2.26 mA of current drawn by a non-driven pad of the line driver. Thus, the static current drain of the line driver may be reduced compared to other center-tap line drivers.

Second, when a pad is not being driven, transistors M3 and M4 are grounded, and the corresponding input resistance of the non-driven pad is $R_{fb}$, which may be a relatively high impedance of 2475 ohms.

The present invention may be capable of other and different embodiments, and its several details are capable of modification. For example, FIG. 5 is an electrical schematic of an embodiment of the controlled current buffer shown in FIG. 3, particularly illustrating the reference voltage circuit. Where appropriate, the same reference numerals are used to avoid unnecessary duplication and description of similar elements already referred to and described above. The differences between the second embodiment and the first embodiment will be discussed hereafter.

Amplifiers 78 and 80 may each act as a single-stage amplifier that applies the reference voltage $V_{ref}$ to the ends of the internal resistor and feedback resistor, respectively. With the benefit of this disclosure, one of ordinary skill in the art may readily design such a circuit, and other circuits that have the functionality of providing a reference voltage and current mirror may be readily substituted for the embodiment shown in FIG. 5, and still be within the spirit and scope of the invention.

Furthermore, the internal resistor shown in FIG. 3 may have a value that may be twice the previously described feedback resistor and, correspondingly, the gain of M7 and M8 may be reduced by one-half. This would further reduce the current drain of the line driver.

Figure 6:
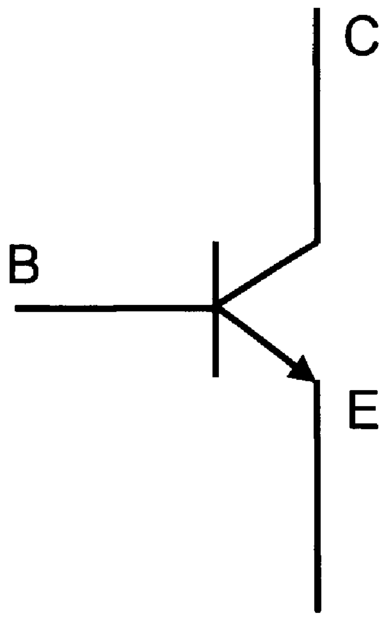
FIG. 6 is an electrical schematic of a type of bipolar transistor that can be employed in the line driver shown in FIG. 3 and the controlled current buffer shown in FIG. 4.

FIG. 6 illustrates a type of bipolar transistor that can be employed in the line driver shown in FIG. 3 and the controlled current buffer shown in FIG. 4.

With the benefit of this disclosure, a skilled artisan will recognize that the current mirrors and amplifiers may be designed with various technologies, such as, for example, bipolar, field effect, p-n-p, n-p-n, complementary metal oxide semiconductor (CMOS), negative-channel metal oxide semiconductor (NMOS), positive-channel metal oxide semiconductor (PMOS), among others.

In conclusion, the line driver described herein presents matched impedance to a driven pad, high input impedance to a non-driven pad, and may do so with lower current drain than other center-tap line drivers. This may be primarily accomplished by a feedback resistor and a controlled current buffer coupled between the output of a driver current mirror and input of the current mirror, wherein the controlled current buffer may be responsive to the static current flowing through the feedback resistor to output a substantially zero static current.

With the benefit of this disclosure, those skilled in the art may recognize that other modifications and variations may be made in the line of the present invention and in construction and operation of this line driver without departing from the scope or spirit of this invention.

A number of embodiments of the invention have been described. Nevertheless, it may be understood that various modifications may be made without departing from the spirit and scope of the invention. Accordingly, other embodiments are within the scope of the following claims.

What is claimed is:

1. A line driver with an integrated termination, the line driver comprising:

a driver current mirror having an input and an output;

an internal resistor having a first end and a second end, the first end of the internal resistor being coupled with a bias voltage;

a first buffer current mirror having an input and an output, the output of the first buffer current mirror being coupled with the second end of the internal resistor; and a second buffer current mirror having an input coupled with the output of the first buffer current mirror and an output coupled with the input of the driver current mirror; and a feedback resistor having a first end and a second end, the first end of the feedback resistor being coupled with the output of the driver current mirror, and the second end of the feedback resistor being coupled with the input of the first buffer current mirror.

2. The line driver of claim 1 wherein the first buffer current mirror comprises:

a first field effect transistor having a drain and a gate, the drain of the first field effect transistor being coupled with second end of the feedback resistor; and a second field effect transistor having drain and a gate, the gate of the second field effect transistor being coupled with the gate of the first field effect transistor, and the drain of the second field effect transistor being coupled with the second end of the internal resistor.

3. The line driver of claim 1 wherein the second buffer current mirror comprises:

a first field effect transistor having a drain and a gate, the drain of the first field effect transistor being coupled with second end of the feedback resistor; and a second field effect transistor having drain and a gate, the gate of the second field effect transistor being coupled with the gate of the first field effect transistor, and the drain of the second field effect transistor being coupled with the input of the driver current mirror.

4. The line driver of claim 1 wherein the impedance of the internal resistor is approximately equal to the impedance of the feedback resistor.

5. The line driver of claim 1 wherein the driver current mirror comprises:

a first field effect transistor having a drain and a gate coupled together, the drain of the first field effect transistor being coupled with the output of the driver current mirror; and a second field effect transistor having drain and a gate, the gate of the second field effect transistor being coupled with the gate of the first field effect transistor, and the drain of the second field effect transistor being coupled with the output of the driver current mirror.

6. A line driver with an integrated termination, the line driver comprising:

a first bipolar transistor having a collector and a base coupled together;

a second bipolar transistor having collector and a base, the base of the second bipolar transistor being coupled with the base of the first bipolar transistor;

an internal resistor having a first end and a second end, the first end of the internal resistor being coupled with a bias voltage;

a first buffer current mirror having an input and an output, the output of the first buffer current mirror being coupled with the second end of the internal resistor; and a second buffer current mirror having an input coupled with the output of the first buffer current mirror and an output coupled with the collector of the first bipolar transistor; and a feedback resistor having a first end and a second end, the first end of the feedback resistor being coupled with the collector of the first bipolar transistor, and the second end of the feedback resistor being coupled with the input of the first buffer current mirror.

7. The line driver of claim 6 wherein the first buffer current mirror comprises:

a third bipolar transistor having a collector and a base, the collector of the third bipolar transistor being coupled with second end of the feedback resistor; and a fourth bipolar transistor having collector and a base, the base of the fourth bipolar transistor being coupled with the base of the third bipolar transistor, and the collector of the fourth bipolar transistor being coupled with the second end of the internal resistor.

8. The line driver of claim 6 wherein the second buffer current mirror comprises:

a third bipolar transistor having a collector and a base, the collector of the third bipolar transistor being coupled with second end of the feedback resistor; and a fourth bipolar transistor having collector and a base, the base of the fourth bipolar transistor being coupled with the base of the third bipolar transistor, and the collector of the fourth bipolar transistor being coupled with the input of the driver current mirror.

9. The line driver of claim 6 wherein the impedance of the internal resistor is approximately equal to twice the impedance of the feedback resistor.

* * * * *